United States Patent

Kangas

(10) Patent No.: US 8,106,333 B2
(45) Date of Patent: Jan. 31, 2012

(54) HEATED FREQUENCY CONVERTER ASSEMBLY

(75) Inventor: Jani Kangas, Espoo (FI)

(73) Assignee: Abb Oy, Helsinki (FI)

( * ) Notice: Subject to any disclaimer, the term of this patent is extended or adjusted under 35 U.S.C. 154(b) by 842 days.

(21) Appl. No.: 12/117,752

(22) Filed: May 9, 2008

(65) Prior Publication Data

US 2008/0283514 A1 Nov. 20, 2008

(30) Foreign Application Priority Data

May 16, 2007 (FI) ...................................... 20075356

(51) Int. Cl.
*F23Q 7/00* (2006.01)
(52) U.S. Cl. ...................................................... 219/260
(58) Field of Classification Search ........................ None
See application file for complete search history.

(56) References Cited

U.S. PATENT DOCUMENTS

| 2006/0202304 A1 | 9/2006 | Orr |
| 2007/0007055 A1 | 1/2007 | Schmidt et al. |

FOREIGN PATENT DOCUMENTS

| JP | 60-035937 A | 2/1985 |
| JP | 5-152779 A | 6/1993 |
| JP | 2006-135186 A | 5/2006 |

OTHER PUBLICATIONS

Non-English language version of Finnish Search Report (with English translation of category of cited documents) dated Feb. 19, 2008.
Non-English language vesion of Finnish Office Action dated Feb. 19, 2008.

*Primary Examiner* — Daniel L Robinson
(74) *Attorney, Agent, or Firm* — Buchanan Ingersoll & Rooney PC

(57) ABSTRACT

A heated frequency converter assembly having a resistor element and/or brake means that are configured to heat the frequency converter assembly to produce a sufficiently high operating temperature and/or to prevent moisture condensation.

4 Claims, 2 Drawing Sheets

HEATED FREQUENCY CONVERTER ASSEMBLY

BACKGROUND OF THE INVENTION

The invention relates to a heated frequency converter assembly and a method for heating a frequency converter assembly.

It is known in the art to provide a frequency converter assembly with a heating system to obtain a sufficiently high operating temperature and/or to prevent moisture condensation. A prior art heating system for a frequency converter assembly comprises one or more heating resistor elements, through which current is fed when the assembly is to be heated. When heating is not needed, no current is fed through the heating resistor elements.

A problem with the above arrangement is the space needed by the heating system and the increase in weight and costs it causes.

BRIEF DISCLOSURE OF THE INVENTION

It is an object of the invention to provide a heated frequency converter assembly and a method for heating a frequency converter assembly so as to allow the above problems to be solved. The object of the invention is achieved by a frequency converter assembly and a method characterized by what is stated in the independent claims. The preferred embodiments of the invention are disclosed in the dependent claims.

The basic idea of the invention is to utilize resistive components already present in a frequency converter assembly not only for their actual purpose of use but also for heating the frequency converter assembly to obtain a sufficiently high operating temperature and/or to prevent moisture condensation.

An advantage of the invention is that it allows the space required by the heating system of the frequency converter assembly, its weight and its manufacturing costs to be reduced.

BRIEF DESCRIPTION OF THE FIGURES

In the following the invention will be described in greater detail in connection with preferred embodiments and with reference to the accompanying drawings, in which.

DETAILED DISCLOSURE OF THE INVENTION

Figure 1:
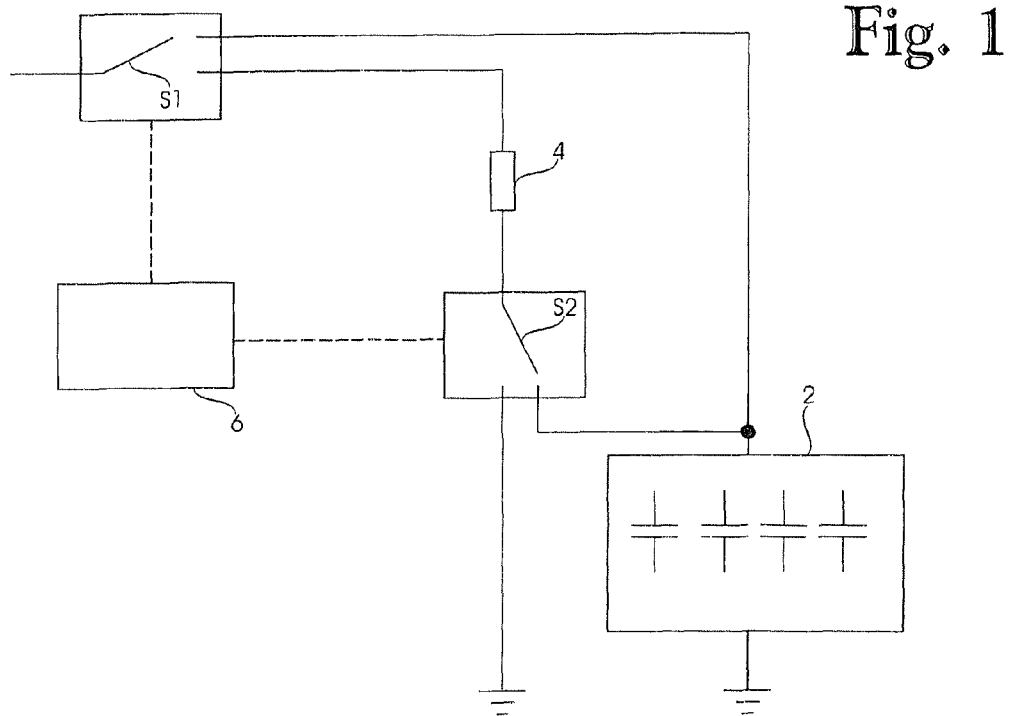
FIG. 1 illustrates a heating connection provided with a heating switch in a heated frequency converter assembly of the invention.

The heating connection of FIG. 1 comprises a charge switch S1, heating switch S2, capacitor element 2, charge resistor element 4 and control means 6. The capacitor element 2 is arranged to smooth voltage variations occurring in the DC voltage intermediate circuit (not shown) of the frequency converter. The charge resistor element 4 is arranged to restrict the charging current of the capacitor element 2 at the start-up of the frequency converter, for example. The charge resistor element 4 is placed into the frequency converter assembly so as to allow the heat it produces to be utilized for heating the frequency converter assembly.

With the charge switch S1 of the connection of FIG. 1 in a first position, the current flows from the charge switch S1 to the capacitor element 2 and further to ground, the charge resistor element 4 and the heating switch S2 being currentless. In a second position of the charge switch S1 the current flows through the charge resistor element 4 and the heating switch S2. With the heating switch S2 is in its charging position, the current flowing through the charge resistor element 4 also passed through the capacitor element 2. Then again, when the heating switch S2 occupies its heating position, the current flowing through the charge resistor element 4 does not pass through the capacitor element 2.

The control means 6 are arranged to measure temperature and to change the position of the heating switch S2 between the charging position and the heating position in response to the measured temperature. In an alternative embodiment of the invention the control means 6 may be configured to measure humidity and to change the position of the heating switch S2 between the charging position and the heating position in response to the measured humidity. Further, it is possible to arrange the control means 6 to measure both temperature and humidity and to change the position of the heating switch S2 between the charging position and the heating position in response to the temperature and humidity measurements.

In addition to controlling the heating switch S2, the control means 6 are arranged to change the position of the charge switch S1 between a first position and a second position.

Figure 2:
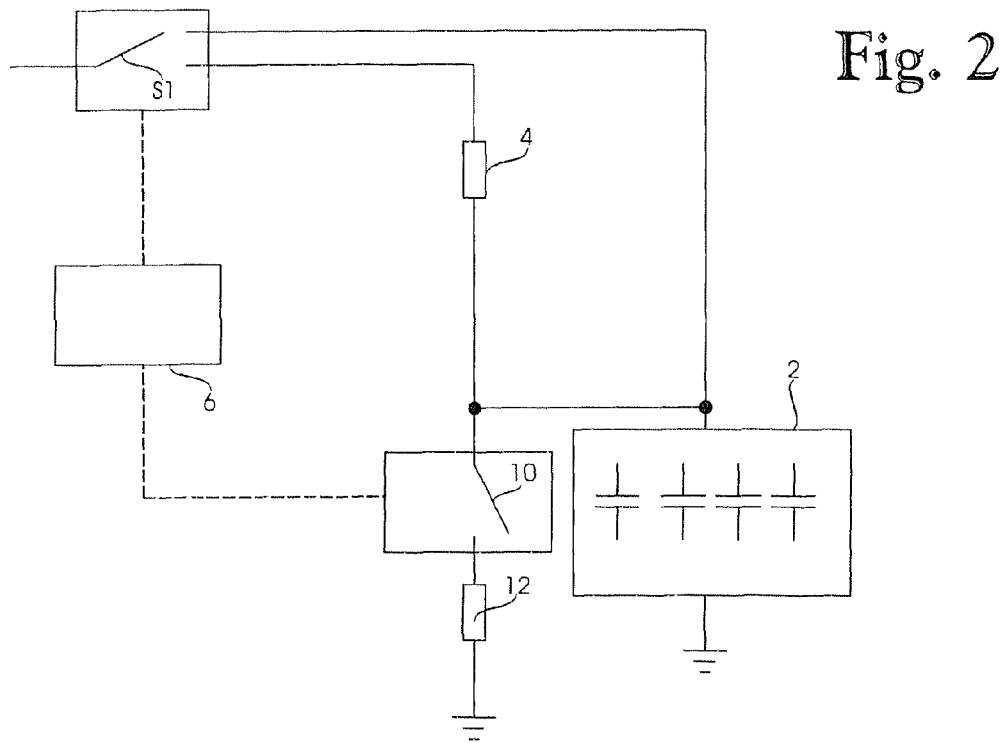
FIG. 2 illustrates a heating connection employing a brake chopper switch.

The heating connection of FIG. 2 comprises a charge switch S1, capacitor element 2, charge resistor element 4, control means 6, brake chopper switch 10 and brake resistor element 12. The branch with the brake chopper switch 10 extends from a point between the charge resistor element 4 and the capacitor element 2 to ground. The brake resistor element 12 is connected in series with the brake chopper element 10, between the brake chopper element 10 and ground. The brake chopper element 10 and the brake resistor element 12 of the frequency converter assembly form a unit that is arranged to be connected to a DC voltage intermediate circuit of the frequency converter assembly in such a way that when the brake chopper switch 10 is in its off-position, there is a current flow from a positive branch of the DC voltage intermediate circuit to a negative branch of the DC voltage intermediate circuit through the brake resistor element 12. This kind of coupling allows a braking action to be implemented in a motor fed by the frequency converter.

With the charge switch S1 in a first position and the brake chopper switch 10 in the off-position, current flows from the charge switch S1 to the capacitor element 2 and further to ground. With the charge switch S1 in the first position and the brake chopper switch 10 in the on-position, current flows from the charge switch S1 to ground through the capacitor element 2 and the brake chopper switch 10 connected in parallel. With the charge switch S1 in a second position and the brake chopper switch 10 in the off-position, current flows from the charge switch S1 to the charge resistor element 4 and the capacitor element 2 connected in series and further to ground. With the charge switch S1 in the second position and the brake chopper switch 10 in the on-position, current flows from the charge switch S1 first to the charge resistor element 4 and further to the capacitor element 2 and the brake resistor element 12 connected in parallel, and then to ground.

The control means 6 function as described in connection with the embodiment of FIG. 1, i.e. they are arranged to measure temperature and/or humidity and to change the position of the brake chopper switch 10 between an on-position and an off-position in response to the measured temperature and/or humidity.

Among the heating connection components of FIG. 2 both the brake resistor element 12 and the charge resistor element 4 are placed so as to allow them to be utilized in the heating of the frequency converter assembly. According to an alternative embodiment the brake resistor element 12 is replaced with a short circuit, the heating of the frequency converter assembly being then carried out by the charge resistor element 4 alone.

Figure 3:
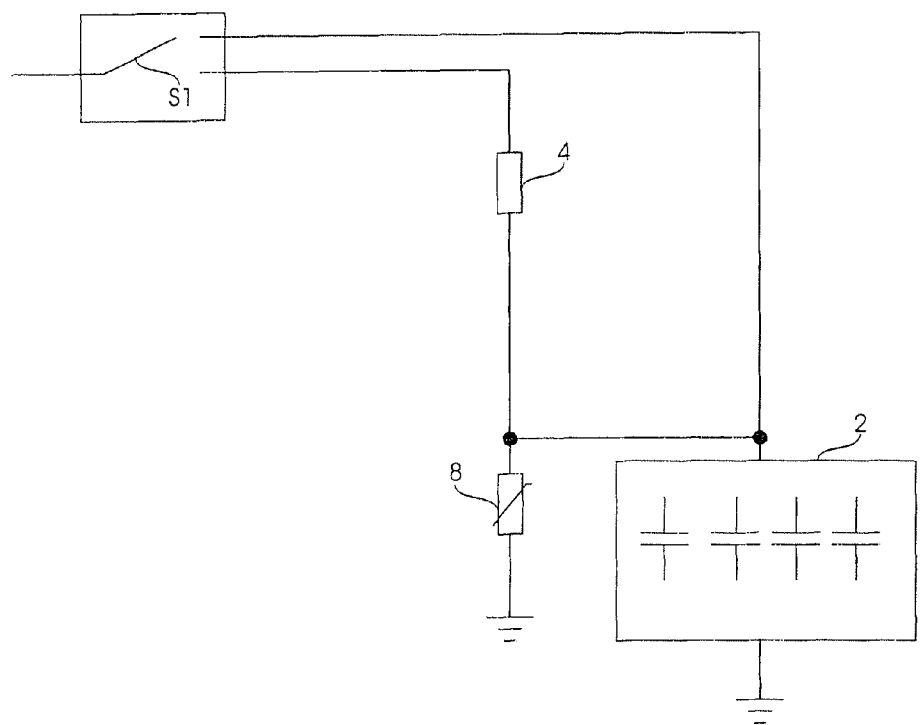
FIG. 3 illustrates a heating connection provided with a PTC resistor element.

The heating connection of FIG. 3 comprises a charge switch S1, capacitor element 2, charge resistor element 4 and PTC resistor element 8. The PTC resistor element 8 is connected between ground and a point between the charge resistor element 4 and the capacitor element 2. Hence the PTC resistor element 8 is connected in parallel with the capacitor element 2.

With the charge switch S1 in the first position, current flows from the charge switch S1 to the capacitor element 2 and the PTC resistor element 8 connected in parallel and from there to ground. With the charge switch S1 in the second position, current flows from the charge switch S1 first to the charge resistor element 4, then to the capacitor element 2 and the PTC resistor element 8 connected in parallel and from there to ground.

The resistance of the PTC resistor element 8 depends on temperature in that as temperature rises, the resistance increases. The higher the temperature, the less current flows through the PTC resistor element 8. The PTC resistor element 8 is placed into the frequency converter assembly preferably in such a way that the heat it produces can be utilized for heating the frequency converter assembly.

In an alternative embodiment of the invention a separate heating resistor element is connected in series with the PTC resistor 8 of the heating connection of FIG. 3.

Figure 4:
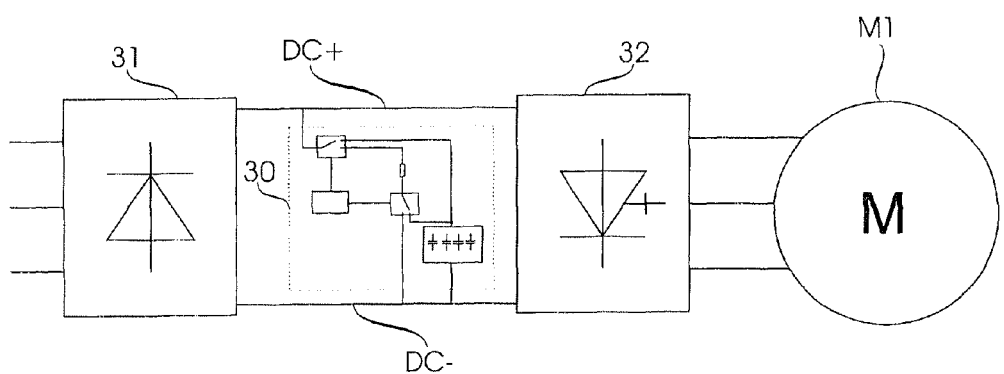
FIG. 4 illustrates a frequency converter assembly comprising the heating connection of FIG. 1.

FIG. 4 illustrates a frequency converter assembly comprising the heating connection of FIG. 1. In FIG. 4 the heating connection of FIG. 1 is referred to with reference numeral 30. The heating connection 30 is connected between a positive branch DC+ and a negative branch DC− of the DC voltage intermediate circuit of the frequency converter assembly. The charge switch is connected to the positive branch DC+ and the ground connections of the heating switch and the capacitor element to the negative branch DC−. The DC voltage intermediate circuit is connected between a rectifier unit 31 and an inverter unit 32. The output of the inverter unit 32 has an electric motor or M1 connected thereto. The input of the rectifier unit 31 is configured to be connected to a power line.

A person skilled in the art will find it obvious that the basic idea of the invention may be implemented in various ways. The invention and its embodiments are therefore not restricted to the above examples but may vary within the scope of the claims.

The invention claimed is:

1. A heated frequency converter assembly comprising a capacitor element and a charge resistor element configured to restrict a charging current of the capacitor element, wherein the charge resistor element is further configured to heat the frequency converter assembly in order to produce a sufficiently high temperature of operation and/or to prevent moisture condensation, wherein the frequency converter assembly has a charging mode, in which the current flowing through the charge resistor element also passes through the capacitor element, and a heating mode, in which at least an essential part of the current flowing through the charge resistor element does not pass through the capacitor element, wherein the heated frequency converter assembly further comprises a brake chopper switch configured to produce a braking connection of the frequency converter assembly and further configured to change the operating mode of the frequency converter assembly between a charging mode and a heating mode.

2. A heated frequency converter assembly, according to claim 1, wherein the heated frequency converter assembly further comprises a brake resistor element connected in series with a brake chopper switch and configured to heat the frequency converter assembly in the heating mode.

3. A heated frequency converter assembly according to claim 1, wherein the heated frequency converter assembly further comprises control means configured to measure temperature and/or humidity and to change the operating mode of the frequency converter assembly between the charging mode and the heating mode in response to the measured temperature and/or humidity.

4. A heated frequency converter assembly according to claim 2, wherein the heated frequency converter assembly further comprises control means configured to measure temperature and/or humidity and to change the operating mode of the frequency converter assembly between the charging mode and the heating mode in response to the measured temperature and/or humidity.

* * * * *